(12) United States Patent
Liu et al.

(10) Patent No.: US 7,473,625 B2
(45) Date of Patent: Jan. 6, 2009

(54) LDMOS DEVICE AND METHOD OF FABRICATION

(75) Inventors: Mu-Yi Liu, Taichung (TW); Chia-Lun Hsu, Taipei (TW); Ichen Yang, Changhua (TW); Kuan-Po Chen, Taipei (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/100,688

(22) Filed: Apr. 7, 2005

(65) Prior Publication Data

US 2006/0017102 A1 Jan. 26, 2006

Related U.S. Application Data

(60) Provisional application No. 60/590,305, filed on Jul. 22, 2004.

(51) Int. Cl.
*H01L 21/3205* (2006.01)
(52) U.S. Cl. .................. 438/591; 438/981; 257/335; 257/411
(58) Field of Classification Search ................ 257/335, 257/339, 341, 342, 344, 345, 411, E21.639, 257/E29.256; 438/981
See application file for complete search history.

(56) References Cited

U.S. PATENT DOCUMENTS 5,264,719 A * 11/1993 Beasom ...................... 257/335
5,569,937 A * 10/1996 Bhatnagar et al. ............. 257/77
5,627,394 A * 5/1997 Chang et al. ................. 257/335
6,441,431 B1 8/2002 Efland et al.
6,444,550 B1 9/2002 Hao et al.
6,448,625 B1 9/2002 Hossain et al.
6,468,870 B1 10/2002 Kao et al.
6,531,355 B2 3/2003 Mosher et al.
6,580,131 B2 6/2003 Huang et al.
6,744,101 B2 * 6/2004 Long et al. ................... 257/368
2002/0030225 A1 * 3/2002 Nakamura et al. ............ 257/338
2003/0141559 A1 * 7/2003 Moscatelli et al. ........... 257/406

OTHER PUBLICATIONS

Zeitzoff, Peter M., "Front-End Trends, Challenges, and Potential Solutions for the 180-100 nm IC Technology Generations" Semiconductor Fabtech 10th Edition, 275-281.

* cited by examiner

*Primary Examiner*—Phat X. Cao
*Assistant Examiner*—Abul Kalam
(74) *Attorney, Agent, or Firm*—Kenta Suzue; Haynes Beffel & Wolfeld LLP

(57) ABSTRACT

An LDMOS device and method of fabrication are provided. The LDMOS device has a substrate with a source region and a drain region formed in the substrate. An insulating layer is provided on a portion of the substrate between the source and the drain region, such that a planar interface is provided between the insulating layer and a surface of the substrate. An insulating member is then formed on a portion of the insulating layer, and a gate layer is formed over part of the insulating member and the insulating layer. By employing such a structure, it has been found that a flat current path exists which enables the on-resistance to be decreased whilst maintaining a high breakdown voltage.

10 Claims, 4 Drawing Sheets

LDMOS DEVICE AND METHOD OF FABRICATION

RELATED APPLICATIONS

This application claims the benefit of U.S. Provisional Application No. 60/590,305 filed 22 Jul. 2004.

BACKGROUND OF THE INVENTION

1. Field of the Invention

The present invention relates generally to semiconductor devices, and more particularly to a lateral double diffused metal oxide semiconductor (LDMOS) device and a method of fabricating such a device.

2. Description of the Prior Art

LDMOS devices are typically used in high voltage applications, and when designing such LDMOS devices, it is important that the device should have a very high breakdown voltage ($V_{bd}$), whilst also exhibiting, when operating, a low on-resistance (Ron). By designing LDMOS devices with low on-resistance and high breakdown voltage, such devices will typically exhibit low power loss in high voltage applications. In addition, by exhibiting a low on-resistance, a high drain current (Idsat) can be achieved when the transistor is in saturation. One problem when designing such LDMOS devices is that techniques and structures that tend to maximise $V_{bd}$ tend to adversely affect the Ron and vice versa.

It is well known in the art to seek to increase the breakdown voltage by producing a field oxide (FOX) underlying a portion of the gate (this portion of the gate being referred to as the field plate), the FOX layer reducing electric field crowding at the gate edge. FIG. 1 is a cross-sectional view of such a conventional LDMOS device 100. As illustrated in FIG. 1, drain region 106 is formed within an N well 104 and source region 108 is formed within a P-substrate 102. A gate 110 is formed on the surface of the substrate, one portion of which is separated from the substrate by a thin insulating oxide layer. A FOX layer 112 is formed between the substrate 102 and a further portion of the gate 110. The FOX layer consumes silicon in the substrate as it is formed, the formation of the FOX layer typically being via a thermal oxidation process.

U.S. Pat. Nos. 6,448,625 B, 6,468,870 B, 6,531,355 B and 6,580,131 B illustrate various designs of MOS and LDMOS devices which incorporate such a FOX layer.

U.S. Pat. No. 6,441,431 B describes an LDMOS device in which a dielectric insulating layer is formed between the gate and the substrate having two portions of different thicknesses. The formation of this dielectric insulating layer with two different thickness portions is discussed at column 4 of that document. As discussed at column 4, lines 48 to 60, preferably both portions of the dielectric layer are comprised of the same material and are formed using a thermally grown silicon dioxide layer.

Whilst the prior art techniques such as those discussed above provide insulating layers which seek to increase the breakdown voltage of the device, it would be desirable to further improve the trade off between high breakdown voltage and reduced on-resistance. In particular it would be desirable to enable the on-resistance to be further reduced within a device exhibiting a particular breakdown voltage.

SUMMARY OF THE INVENTION

Viewed from a first aspect, the present invention provides a lateral double diffused metal oxide semiconductor (LDMOS) device, comprising: a substrate; a source region and a drain region formed in the substrate; an insulating layer provided on a portion of the substrate between said source region and said drain region, such that a planar interface is provided between said insulating layer and a surface of the substrate; an insulating member formed on a portion of said insulating layer; and a gate layer formed over part of said insulating member and said insulating layer.

The inventors of the present invention realised that in the known prior art designs which incorporate a FOX layer, the fact that the lower surface of the FOX layer is below the lower surface of the adjacent thin oxide insulating layer means that the current path near the interface between the substrate and the insulating layer will exhibit a recess current path due to the current needing to deviate to follow the contour of the lower surface of the FOX layer. Further, when that current path changes from the underside of the thin insulating layer to the underside of the FOX layer, the inventors realised that the current spreading resistance will increase. Both of these factors cause an increase in the on-resistance.

Having recognised that a recess current path will form near the interface between the insulating layer and the substrate, and that an increased spreading resistance would also occur near that interface, the inventors of the present invention have designed an LDMOS device where an insulating layer is provided on a portion of the substrate between the source region and the drain region, that has a planar interface between it and the surface of the substrate. Then, in order to achieve an increase in the breakdown voltage, the inventors of the present invention have provided an insulating member that is formed on a portion of the insulating layer in order to provide a thicker insulating region, and a gate layer is then formed over part of the insulating member and the insulating layer. Hence an LDMOS device can be produced which exhibits a high breakdown voltage, and due to the planar interface between the insulating layer and the surface of the substrate, a decrease in on-resistance can also be obtained.

In one embodiment the insulating member is formed on the insulating layer via a deposition process. By depositing the insulating member onto the insulating layer, the planar interface between the insulating layer and the surface of the substrate is not disturbed.

In such embodiments of the present invention, the insulating member may be formed by performing a sequence of deposition, lithography and etching steps in order to produce the insulating member on a portion of the insulating layer.

In one embodiment, the LDMOS device further comprises a spacer formation located adjacent at least one side wall of the insulating member to form a transition surface for the gate layer between the insulating layer and the insulating member. The transition surface of the spacer formation serves to smooth the transition of the gate layer between the insulating layer and the insulating member, which serves to reduce the electrical field in this portion of the gate and thus increase breakdown voltage.

In one embodiment, said substrate is of a first conductivity type, and said source region and said drain region are of a second conductivity type opposite to said first conductivity type, the device further comprising: a first well region of said second conductivity type formed in the substrate, one of said drain region and said source region being formed inside said first well region; and the first well region being located such that the portion of said insulating layer upon which said insulating member is formed overlies the first well region. In one particular embodiment, the drain region is formed within the first well region, and a doping profile of the first well region is used to act as a double diffused drain. Such a configuration assists the device in sustaining high voltage.

In one embodiment, the LDMOS device further comprises: a channel region formed in the substrate below the insulating layer; and a second well region of said first conductivity type formed in the substrate to provide a doping concentration for said channel region. Accordingly, a required threshold voltage can be achieved by adjusting the doping concentration of the second well region.

In one embodiment, the second well region surrounds the first well region. However, in alternative embodiments the second well region can be separate from the first well region, rather than encompassing it.

The insulating layer may be formed from a variety of materials. However, in one embodiment the insulating layer is formed of silicon dioxide.

In one embodiment the insulating member comprises a dielectric material. As examples, the dielectric material may be one of silicon nitride, silicon oxynitride and silicon enriched oxide.

The spacer formation may be formed of an insulating material, and as an example that insulating material may be one of silicon oxide, silicon nitride and silicon oxynitride. In one particular embodiment, the insulating member is formed of silicon nitride and the spacer formation is formed of silicon oxide.

Viewed from a second aspect, the present invention provides a method of fabricating a lateral double diffused metal oxide semiconductor (LDMOS) device, comprising the steps of: (a) providing a substrate; (b) forming an insulating layer on a portion of the substrate, such that a planar interface is provided between said insulating layer and a surface of the substrate; (c) forming an insulating member on a portion of said insulating layer; (d) forming a gate layer over part of said insulating member and said insulating layer; and (e) forming a source region and a drain region in the substrate such that said portion of the substrate on which the insulating layer is formed at said step (b) lies between said source region and said drain region.

In one embodiment, the step of forming an insulating member comprises the steps of: depositing a layer of insulating material on the insulating layer; and patterning the insulating material to form said insulating member. The patterning process may involve in one embodiment both lithography and etching processes.

In one embodiment of the present invention, the step of forming a spacer formation comprises the steps of: depositing a layer of insulating material over the insulating layer and insulating member; and performing an etching process to form the spacer formation. The etching process may use any appropriate etching type, such as dry etching, wet etching, etc.

Viewed from a third aspect, the present invention provides a lateral double diffused metal oxide semiconductor (LDMOS) device, comprising: a substrate of a first conductivity type; a source region and a drain region formed in the substrate, the source and drain regions being of a second conductivity type opposite to said first conductivity type; an insulating layer provided on a portion of the substrate between said source region and said drain region, such that a planar interface is provided between said insulating layer and a surface of the substrate; an insulating member formed on a portion of said insulating layer; a gate layer formed over part of said insulating member and said insulating layer; a first well region of said second conductivity type formed in the substrate, one of said drain region and said source region being formed inside said first well region; and the first well region being located such that the portion of said insulating layer upon which said insulating member is formed overlies the first well region.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
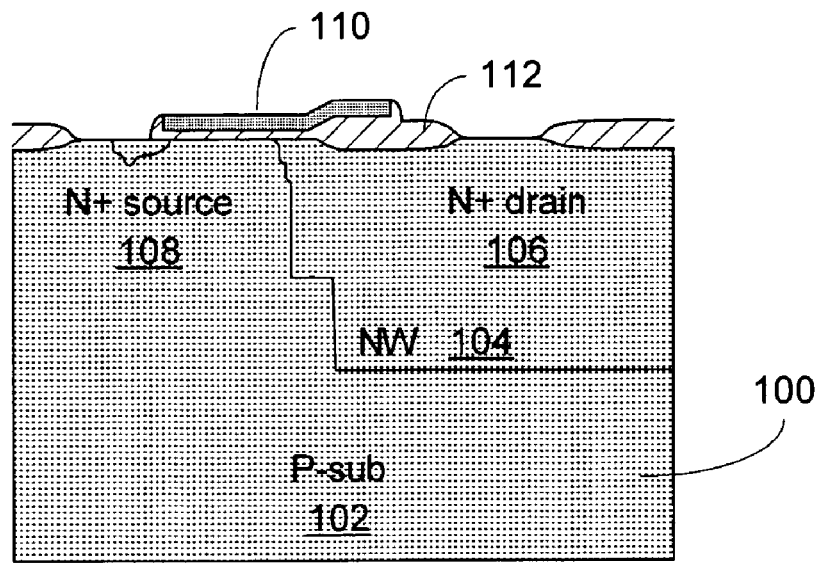
FIG. 1 is a cross-sectional view of a conventional LDMOS device.
Figure 2:
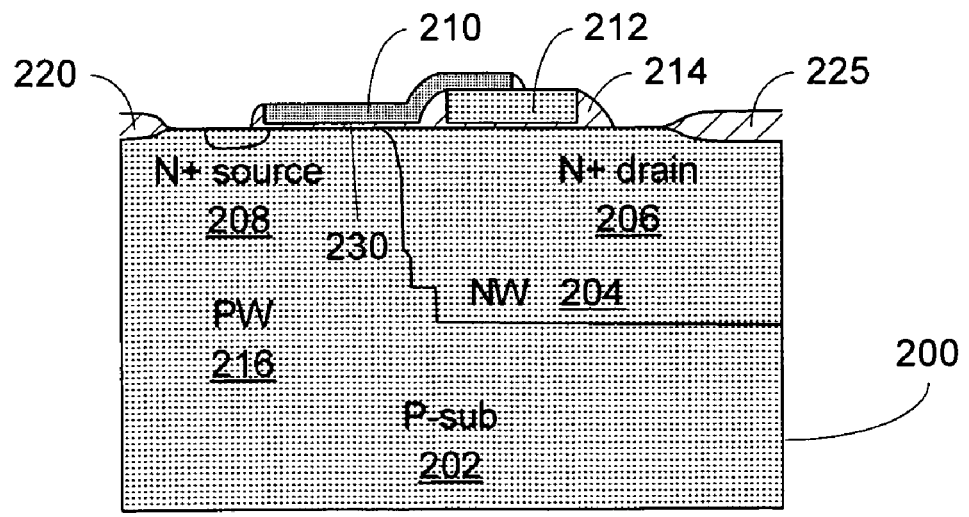
FIG. 2 is a cross-sectional view of an LDMOS device according to one embodiment of the invention.

According to one embodiment of the invention, an LDMOS device having a low on-resistance while exhibiting a high breakdown voltage is provided. As illustrated in FIG. 2, the LDMOS device 200 includes a P type substrate 202, which may for example be formed of single-crystal silicon. An N-type well (NW) region 204 is then formed in the substrate 202, and a first N-type doped region 206 is formed inside the N-well region 204 to form a drain region. A second N-type doped region 208 is formed in substrate 202 to form a source region.

An insulating layer 230 formed of, for example, silicon dioxide is provided on the surface of the substrate between the source region 208 and the drain region 206. This insulating layer has a planar interface with the surface of the substrate. On top of a portion of the insulating layer, an insulating member 212 is formed using a deposition process. The insulating member 212 protrudes above the level of the insulating layer 230 to provide a relatively thick insulating region, but by using such a deposition process, the formation of this insulating member 212 does not disrupt the planer interface between the insulating layer 230 and the surface of the substrate 202. The insulating member 212 may be formed from a variety of materials, and for example may be formed from a dielectric material such as silicon nitride, silicon oxynitride or silicon enriched oxide. These materials are able to block UV-light generated during a plasma process from penetrating to the device. In one particular embodiment, silicon nitride is used as the material for the insulating member 212. FOX regions 220, 225 are provided at each side of the LDMOS device to isolate the device from other devices.

According to one embodiment of the invention, as illustrated in FIG. 2, the insulating member 212 is provided with a spacer formation 214 located at each side of the insulating member, this spacer being formed from an insulating material. As examples, the spacer 214 can be formed from silicon oxide, silicon nitride or silicon oxynitride, and in one particular embodiment silicon oxide is used. The spacer serves to provide a graduated transition surface between the insulating layer 230 and the insulating member 212. In an alternative embodiment, the spacer may be formed on only one side of the insulating member 212.

A gate layer 210 is then formed over a portion of the insulating member 212 and the insulating layer 230, with the transition surface of the spacer reducing the electric field present in the region of the gate transitioning between the insulating layer and the insulating member. The gate layer can be formed of a variety of materials, and in one embodiment it is formed of polysilicon or doped polysilicon.

In one embodiment, as shown in FIG. 2, a P-type well (PW) region 216 is formed in the substrate 202, and may be arranged to either enclose the NW region 204, or instead to be separated from the NW region. In one embodiment, the PW region 216 encloses the first N-type doped region 206, the second N-type doped region 208 and the NW region 204.

A method of fabricating the aforementioned LDMOS device will now be discussed in more detail with reference to FIGS. 3A and 3B. It will appreciated by those skilled in the art that the dopant types of the various regions discussed earlier with reference to FIG. 2 can be changed so as to produce P-type devices instead of N-type devices, and vice versa. Accordingly, for the purposes of FIGS. 3A and 3B, the terms "first conductivity type" and "second conductivity type" will be used. In the embodiment illustrated in FIG. 2, the first conductivity type is P-type and the second conductivity type is N-type.

At step 310, a substrate of a first conductivity type is provided, after which at step 312 a first well region of a second conductivity type is formed in the substrate. Next, at step 314, a second well region of the first conductivity type is also formed in the substrate. These two well regions can be formed using any one of a variety of known techniques, for example using lithography (masking the unwanted area) and implantation (implanting to the wanted area). Further, the ordering of the formation of the two wells can be interchanged.

Next, at step 316, an insulating pattern is formed on the substrate between regions where the first and second doped regions (i.e. source and drain regions) will later be formed. With reference to the earlier FIG. 2, this insulating pattern will be formed by the insulating layer 230 and the insulating member 212 formed thereon, and accordingly will have a flat bottom surface which provides a planar interface with the surface of the substrate. The insulating member 212 can be provided on the insulating layer 230 using, for example, a chemical vapour deposition (CVD) process or any other general film formation process that will ensure that the planar interface with the substrate is maintained.

At step 318, a spacer is formed on the side walls of the insulating pattern, and more specifically on the side walls of the insulating member 212. A spacer may be produced by forming a film over the insulating pattern and the substrate, and then applying an etching back process in order to produce the spacers. The etching back process may be performed using any appropriate etching technique, for example a dry etching technique or a wet etching technique.

Thereafter, at step 320, a gate layer is formed partially overlying the insulating pattern and the substrate underneath the insulating pattern. The gate layer can be formed using any one of a number of known techniques in the art. For example, a doped poly-silicon gate layer may be formed using a thermal or Chemical Vapour Deposition (CVD) process. Then lithography is typically applied and finally an etching process is applied, for example an anisotropic etching to pattern the gate.

Thereafter, a first doped region 206 is formed in the first well region 204 at step 322, and at step 324 a second doped region 208 is formed in the substrate. Both the first and second doped regions are of the second conductivity type. Both steps 322 and 324 may be conducted through conventional masking steps by selective doping of the substrate in the required well region or doped region. The selective doping process may be performed with any conventional method, such as diffusion and ion implantation.

Figure 3A:
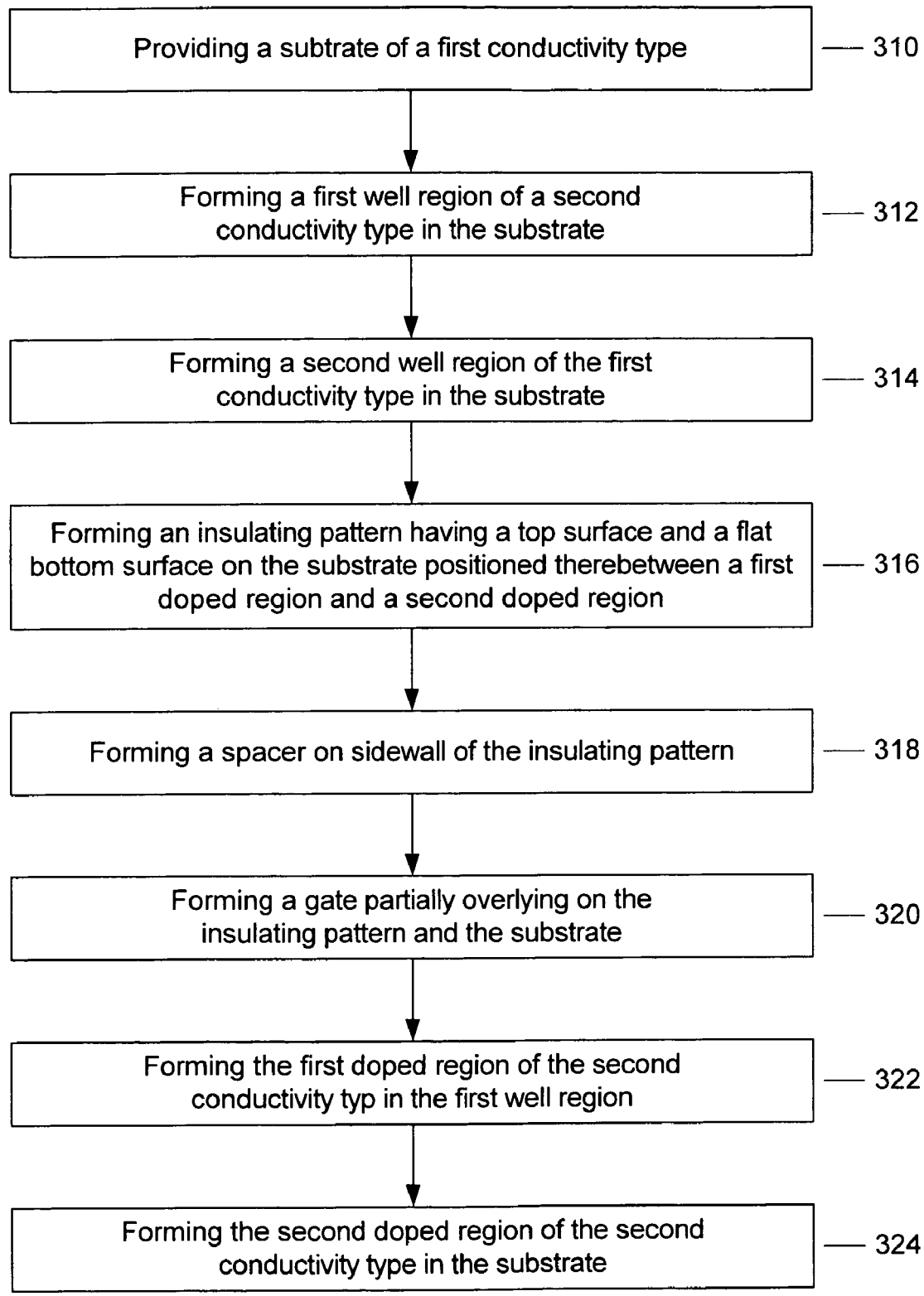
FIGS. 3A and 3B are flow charts illustrating process steps performed in one embodiment of the present invention in order to produce an LDMOS device.
Figure 3B:
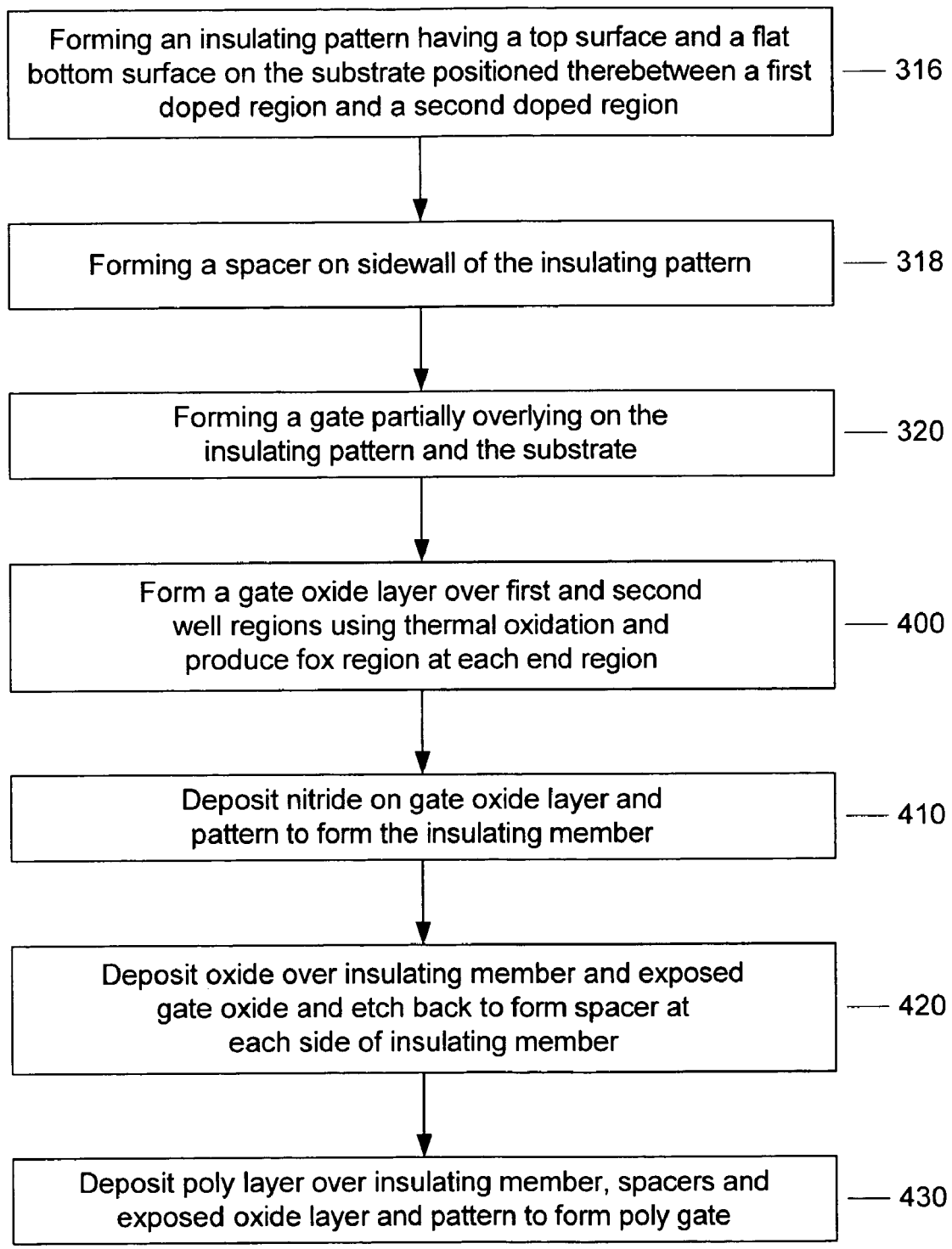

FIG. 3B is a flow diagram illustrating in more detail the process performed in order to implement steps 316, 318 and 320 of FIG. 3A. At step 400, a gate oxide layer is formed over the first and second well regions, and FOX regions 220 and 225 are formed at each end region of the gate oxide layer. The gate oxide layer may be formed using thermal oxidation or CVD, but thermal oxidation has been found to produce a better quality gate oxide layer. The gate oxide layer is used to form the thin insulating layer 230 described earlier with reference to FIG. 2, and has an interface with the substrate that is planar over the length between the source and drain region locations.

Thereafter, at step 410, an insulating member (in this particular example a nitride layer) is formed on the gate oxide layer by deposition of the nitride layer, which is then patterned to form the insulating member 212. The deposition may be performed using a variety of known techniques, for example PECVD (Plasma enhancement chemical vapor deposition), SACVD (semi-atmosphere CVD), HDPCVD (high density plasma CVD), etc. In one embodiment, the patterning process employs both lithography and etching techniques in order to produce the insulating member from the deposited nitride. The etching may use either a dry etching process or a wet etching process, and in one particular embodiment dry etching is used.

Hence, it can be seen that both steps 400 and 410 are used to implement step 316 of FIG. 3A.

Thereafter, the process proceeds to step 420, where an oxide is deposited over the insulating member and exposed gate oxide, after which an etch back process is used to form a spacer at each side of the insulating member 212. The etch back process in one embodiment employs a blank dry etching. Step 420 is hence used to implement step 318 of FIG. 3A.

At step 430, a poly layer is then deposited over the insulating member, spacers and exposed oxide layer, and the poly layer is then patterned to form the poly gate 210. Again, the patterning can be performed using lithography and etching, as will be appreciated by those skilled in the art. Accordingly, step 430 is used to implement step 320 of FIG. 3A.

Figure 4A:
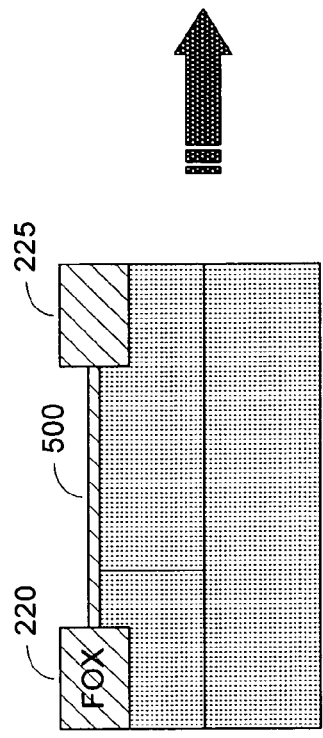
FIGS. 4A to 4D are cross-sectional diagrams schematically illustrating the formation of the LDMOS device in accordance with the method of FIGS. 3A and 3B.
Figure 4B:
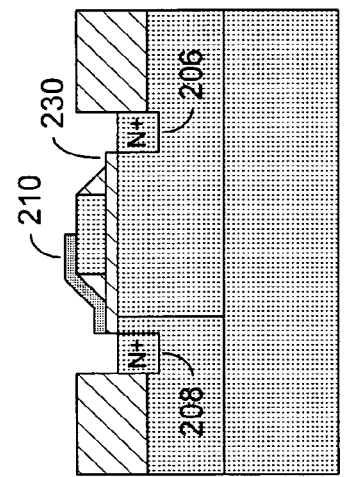

FIGS. 4A to 4D are cross-sectional diagrams illustrating the production of an LDMOS device using the earlier-described method of FIGS. 3A and 3B. FIG. 4A shows the formation of the N well 204 and P well 216 within the P-type substrate 202 in accordance with steps 312 and 314. As then shown in FIG. 4B, a gate oxide layer 500 and two FOX regions 220 and 225 are then produced on the surface of the substrate using thermal oxidation, as discussed earlier with reference to step 400 of FIG. 3B.

Figure 4C:
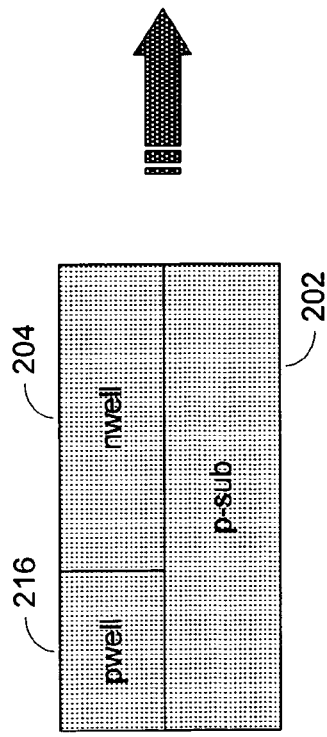

As then shown in FIG. 4C, the insulating member 212 and its associated side walls 214 are then formed on the gate oxide layer 500 using deposition processes, as described earlier with reference to steps 410 and 420 of FIG. 3B.

Figure 4D:
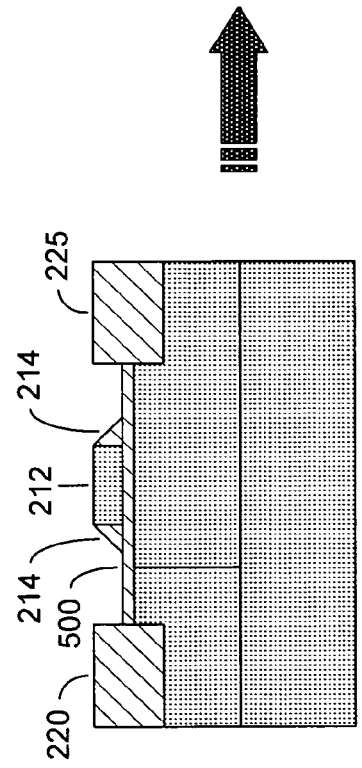

Finally, as shown in FIG. 4D, the polygate 210 is formed using deposition and etching, and the source and drain regions 208, 206 are formed using a selective doping process (see steps 320, 322 and 324 of FIG. 3A). The portions of the gate oxide layer 500 overlying the source and drain region locations will typically be retained as a sacrificial oxide during formation of the source and drain regions, and will then be removed after implantation to form the source and drain regions. An insulating layer 230 is then left on the surface of the substrate between the source and drain regions 208, 206.

In a conventional LDMOS device, where a FOX region is placed beneath the field plate, a recess current path is found to exist due to the current needing to deviate to follow the contour of the lower surface of the FOX layer. Further, when that current path changes from the underside of the thin insulating layer to the underside of the FOX layer, the current spreading resistance increases, and both of these factors cause an increase in the on-resistance (Ron). In order to decrease the Ron, the doping concentration along the current path could be increased, but this would degrade the breakdown characteristic by reducing the breakdown voltage. However, in accordance with embodiments of the present invention, the FOX is replaced with an insulating member, and optionally a spacer formation, and this helps maintain the high breakdown voltage, whilst also allowing the Ron to be decreased (and hence the saturation current (Idsat) to be increased) due to the flat current path that results from such an approach.

Accordingly, better device performance can be achieved due to the flat current path, and the flat current path can be achieved using a simple fabrication process, wherein the usual FOX under field plate is replaced by an insulating member and optionally a spacer. Such a structure can be modified having regard to required breakdown considerations without influencing the isolation.

The LDMOS devices of embodiments of the present invention may be used in a variety of high voltage applications, such as in integrated circuits requiring the sustaining of high voltage breakdown, for example an LCD driver.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of fabricating a lateral double diffused metal oxide semiconductor (LDMOS) device, comprising steps of:
   providing a substrate including a first well having a first conductivity type and a second well having a second conductivity type;
   forming an insulating layer using a first process on a portion of the substrate, such that a planar interface is provided between said insulating layer and a surface of the substrate;
   forming an insulating member using a second process different than the first process, on a portion of said insulating layer having first and second sides over the second well;
   forming a spacer on the first side of the insulating member to form a transition surface for a gate member, comprising:
   (i) depositing a layer of insulating material over the insulating layer and insulating member; and
   (ii) performing an etching process to form the spacer;
   forming the gate member having a second side over part of said insulating member and a first side over said insulating layer over the first well; and
   forming a source region having the second conductivity type in the first well aligned with the first side of the gate member, and a drain region having the second conductivity type in the second well adjacent the second side of the insulating member such that said portion of the substrate on which the insulating layer is formed lies between said source region and said drain region.

2. The method as claimed in claim 1, wherein said step of forming an insulating member comprises forming the insulating member using a deposition process.

3. The method as claimed in claim 1, wherein said step of forming an insulating member comprises the steps of:
   depositing a layer of insulating material on the insulating layer; and
   patterning the insulating material to form said insulating member.

4. The method as claimed in claim 1, wherein said insulating layer is formed of silicon dioxide.

5. The method as claimed in claim 1, wherein the insulating member comprises a dielectric material that is different than the insulating layer.

6. The method as claimed in claim 1, wherein said insulating member consists of one of silicon nitride, silicon oxynitride and silicon enriched oxide.

7. The method as claimed in claim 1, wherein the spacer is formed of an insulating material.

8. The method as claimed in claim 7, wherein said insulating material of the spacer is one of silicon oxide, silicon nitride and silicon oxynitride.

9. The method as claimed in claim 1, wherein the insulating member is formed of silicon nitride and the spacer is formed of silicon oxide.

10. A method of fabricating a lateral double diffused metal oxide semiconductor (LDMOS) device, comprising steps of:
   (a) providing a substrate including a first well having a first conductivity type and a second well having a second conductivity type;
   (b) forming an insulating layer on a portion of the substrate over the first and second wells, such that a planar interface is provided between said insulating layer and a surface of the substrate over the first and second wells;
   (c) patterning an insulating member on a portion of said insulating layer, the insulating member overlying the insulating layer and having first and second sides over the second well;
   (d) depositing a spacer material over the insulating member and the insulating layer, and etching the spacer material to form spacers on the first and second sides of the insulating member exposing a top surface of the insulating layer;
   (e) forming a gate member, the gate member having a first side on said insulating layer over the first well, lying over the spacer on the first side of said insulating member and having a second side over the insulating member; and
   (f) implanting dopants in the first well to define a source region having the second conductivity type aligned with the first side of the gate member, and in the second well to define a drain region having the second conductivity type adjacent the spacer on the second side of the insulating member such that said portion of the substrate on which the insulating layer is formed at said step (b) lies between said source region and said drain region.

* * * * *